United States Patent
Okudaira (12)
(10) Patent No.: US 6,506,613 B1
(45) Date of Patent: Jan. 14, 2003

(54) METHOD FOR MANUFACTURING SEMICONDUCTOR DEVICE HAVING A CAPACITOR

(75) Inventor: Tomonori Okudaira, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 62 days.

(21) Appl. No.: 09/668,341

(22) Filed: Sep. 25, 2000

(30) Foreign Application Priority Data

Apr. 4, 2000 (JP) ........................................ 2000-102167

(51) Int. Cl.$^7$ ................................................. H01G 7/06
(52) U.S. Cl. ............................. 438/3; 438/240; 438/253
(58) Field of Search ................... 438/3, 240, 253–256, 438/396–399, 238, 381

(56) References Cited

U.S. PATENT DOCUMENTS 6,146,906 A * 11/2000 Inoue et al. ............ 204/192.18

FOREIGN PATENT DOCUMENTS

JP        10-247723        9/1998

* cited by examiner

Primary Examiner—Jey Tsai
(74) Attorney, Agent, or Firm—Oblon, Spivak, McClelland, Maier & Neustadt, P.C.

(57) ABSTRACT

An object is to provide a method for manufacturing a semiconductor device in which the value of dielectric loss tangent of the dielectric film forming a storage capacitor is reduced to prevent dielectric loss of stored charge in the storage capacitor. After formation of a stacked capacitor (SC), a silicon substrate (1) is rapidly heated in a nitrogen atmosphere to 500 to 800° C. with, for example, lamp heating, to apply an RTA (Rapid Thermal Annealing) for about 3 to 60 seconds. Subsequently, in order to recover the breakdown voltage reduced in the RTA, the silicon substrate (1) is heated to 300 to 550° C. in an oxidative gas to apply an annealing for 30 minutes to 6 hours.

12 Claims, 9 Drawing Sheets

METHOD FOR MANUFACTURING SEMICONDUCTOR DEVICE HAVING A CAPACITOR

BACKGROUND OF THE INVENTION

1. Field of the Invention

The present invention relates to a method for manufacturing a semiconductor device, and particularly to a method for manufacturing a semiconductor device having storage capacitors.

2. Description of the Background Art

A storage capacitor in a semiconductor storage device must be adapted to data holding of one second or more and read/write cycle of 100 MHz or more, so it is required to allow a wide dynamic range from under 1 Hz to over 100 MHz.

Now, the silicon oxide and silicon nitride films which have been conventionally used as dielectric materials of capacitors are amorphous materials, so that it has been relatively easy to ensure the dynamic range when capacitors are made using these materials. This is because control of in-film defects is relatively easy.

However, the recent reduction in size and increase in integration degree of semiconductor devices are now making it difficult to obtain sufficient electrostatic capacitance using these materials having lower dielectric constants, so that the tendency now is turning toward use of polycrystalline dielectrics having higher dielectric constants, such as ditantalum pentaoxide ($Ta_2O_5$) and BST (barium strontium titanate). $Ta_2O_5$ is usually used in polycrystalline form to obtain higher dielectric constant, though it may be used also in amorphous form.

However, polycrystalline materials generally suffer larger dielectric loss because of the interfacial polarization or orientation polarization due to grain boundary, interface conditions, etc., which applies also to $Ta_2O_5$, BST and the like.

The dielectric loss resulting from the interfacial polarization and orientation polarization will now be described referring to FIGS. 11 and 12.

Figure 11:
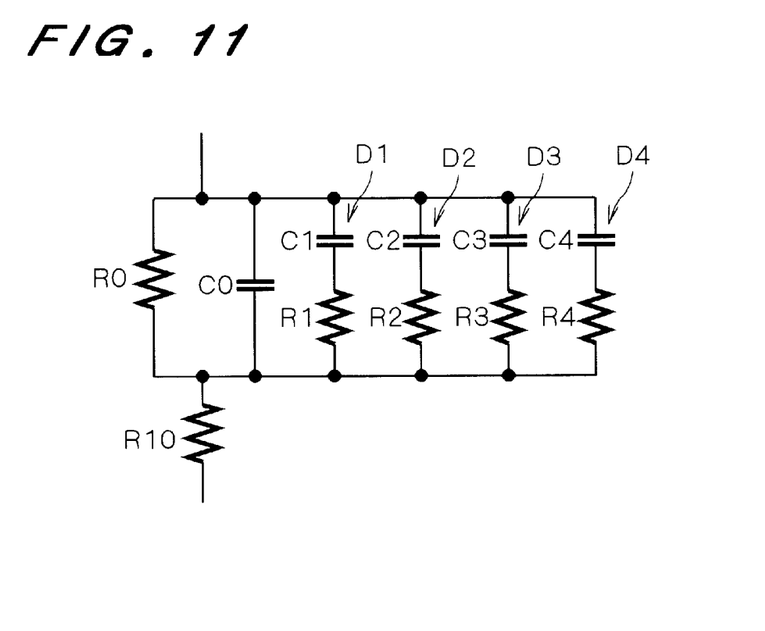
FIGS. 11 to 15 are diagrams used to explain dielectric loss of a capacitor.

FIG. 11 shows an equivalent circuit representing a real capacitor using ideal capacitor and ideal resistor. The ideal capacitor is a capacitor in which resistance and inductance of electrodes and interconnection can be neglected, there is no capacitance variation resulting from the effects of applied voltage, temperature, humidity, pressure, etc., and the time required for polarization is infinitely close to zero; it is thus a capacitor with less capacitance variation due to frequency and no leakage current, for example.

The ideal resistor is a resistor whose characteristics are free from parasitic inductance and variations in resistance value resulting from effects of applied voltage, temperature, humidity, pressure, etc.

However, the leakage current, resistance of electrodes and interconnection, time required for polarization etc. cannot be neglected with a real capacitor; FIG. 11 shows the leakage current component as the resistor R0 parallel-connected to the ideal capacitor C0 and the resistance of electrodes and interconnection as the resistor R10 series-connected to the ideal capacitor C0.

Polarization occurs as positive and negative charges transfer when an electric field is applied to electrodes of the capacitor, which includes the four mechanisms: electronic polarization due to displacement of electron cloud, ionic polarization due to displacement of ions, orientation polarization due to rotation of the dipole moment of molecules, and interfacial polarization caused as charges in the dielectric transfer and are accumulated at the interface. Development of polarization by these mechanisms takes a certain time and a time delay therefore occurs with respect to the phase of the electric field.

The electronic polarization and ionic polarization occur when an electric field having a frequency in the ultraviolet or microwave region is applied, so that the orientation polarization and interfacial polarization must be considered in common semiconductor devices which operate at lower frequencies.

FIG. 11 also shows them as the equivalent circuit. That is to say, the polarization components are represented as the series circuits D1, D2, D3 and D4 formed of the capacitor C1 and resistor R1, the capacitor C2 and resistor R2, the capacitor C3 and resistor R3, and the capacitor C4 and resistor R4 which are connected to the ideal capacitor C0 in parallel.

A product of the capacitor component C (unit F: Farad) and the resistance component R (unit $\Omega$: Ohm) of each circuit corresponds to the relaxation time $\tau$ which is used as an indication of the time required for polarization. Accordingly, when the capacitance values of the capacitors C1 to C4 are taken as $C_1$ to $C_4$ and the resistance values of the resistors R1 to R4 are taken as $R_1$ to $R_4$, then the relaxation times $\tau 1$ to $\tau 4$ of the series circuits D1 to D4 are given as $C_1 R_1$, $C_2 R_2$, $C_3 R_3$ and $C_4 R_4$, respectively.

Generally, while a polarization component functions as capacitor with respect to electric fields having frequencies lower than the reciprocal of the relaxation time, the polarization component cannot follow in operation as capacitor with respect to electric fields having frequencies higher than the reciprocal of the relaxation time, and then the polarization component cannot contribute as capacitance.

Study on the frequency characteristic of the capacitor capacitance shows a trend that the capacitance becomes smaller at higher frequencies, which is due to the fact that the polarization components cannot follow at high frequencies and therefore cannot contribute as capacitance. It is assumed in FIG. 11 that four polarization components having different relaxation times exist and they are shown as the series circuits D1 to D4.

In this example, the relaxation times $\tau 1$ to $\tau 4$ are assumed to become larger in the order of the relaxation time $\tau 1$, which is the shortest, and then $\tau 2$, $\tau 3$, and $\tau 4$.

Figure 12:
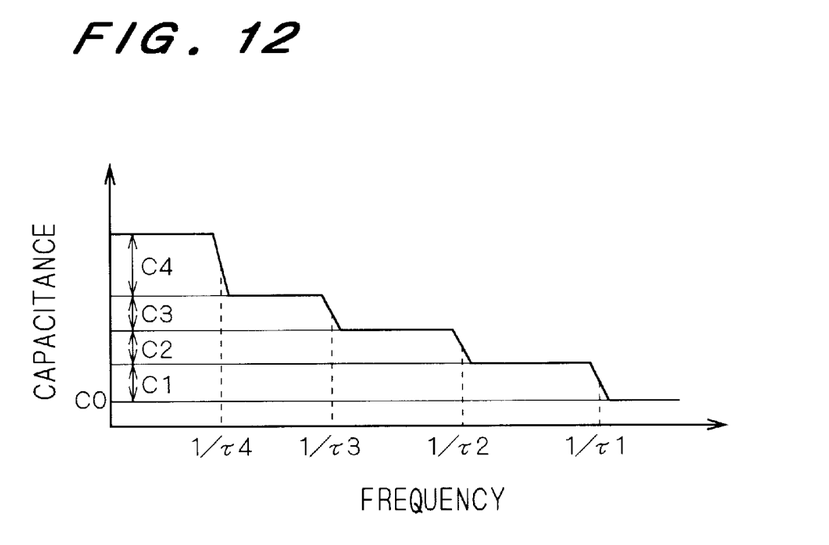

A real capacitor having such configuration exhibits a frequency characteristic as shown in FIG. 12.

That is to say, when the frequency is represented as the reciprocal of the relaxation time, and if the frequency is lower than $1/\tau 4$, all of the capacitors C1 to C4 as polarization components can follow in polarization, so that the capacitance of the real capacitor is the sum total of the ideal capacitor C0 and the capacitors C1 to C4.

However, when the frequency becomes equal to or higher than $1/\tau 4$, then the capacitor C4 cannot follow, and the capacitance of the real capacitor is the sum total of the ideal capacitor C0 and the capacitors C1 to C3.

Similarly, when the frequency becomes equal to or higher than $1/\tau 3$, the capacitor C3 cannot follow, and when the frequency becomes equal to or higher than $1/\tau 2$, the capacitor C2 cannot follow, and when the frequency becomes equal to or higher than $1/\tau 1$, the capacitor C1 cannot follow, and finally, all of the polarization components cannot contribute as capacitance and only the capacitance of the ideal capacitor C0 remains.

Actually, the relaxation times of the polarization components continuously exist and the frequency characteristic also vary continuously.

Figure 13:
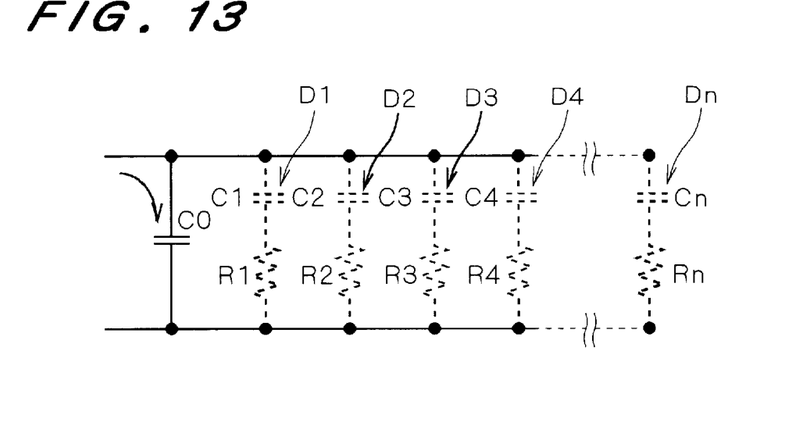
Figure 14:
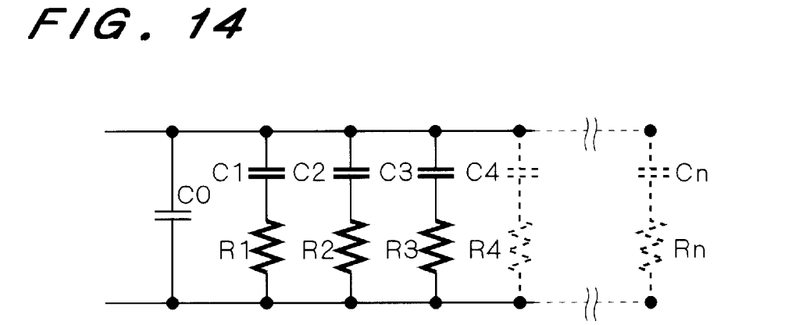
Figure 15:
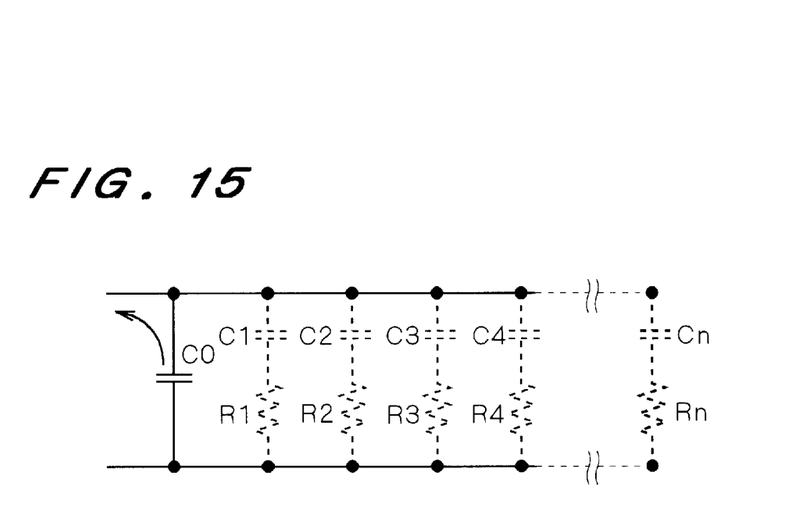

A storage capacitor in a semiconductor storage device can be represented similarly as a plurality of capacitors in which polarization components are connected in parallel; FIGS. 13 to 15 show a problem of the storage capacitor which is caused by dielectric loss resulting from interfacial polarization and orientation polarization.

In FIGS. 13 to 15, the storage capacitor CP which is subjected to writing and reading of data is shown as a capacitor having, in addition to the ideal capacitor C0, the series circuits D1 to Dn as polarization components, which are formed of n capacitors C1 to Cn and resistors R1 to Rn series-connected respectively to the capacitors C1 to Cn.

As stated above, the capacitors C1 to Cn have different relaxation times $\tau 1$ to $\tau n$, where $\tau 1$ is the shortest and $\tau n$ is the longest.

FIG. 13 shows a condition of the storage capacitor thus constructed, where data is written in for the first time.

In FIG. 13, charge is stored in the ideal capacitor C0; when the frequency of the applied voltage for writing is higher than $1/\tau 1$, the capacitors C1 to Cn cannot follow in the operation of storing charge and they cannot contribute to the storage of charge. Series circuits which cannot follow are shown by broken lines.

Accordingly, as shown by the equation (1) below, the amount of charge, $Q_A$, of the storage capacitor CP is given as a product of the capacitance $C_0$ of the ideal capacitor C0 and the voltage $V_0$ applied to the electrodes of the storage capacitor CP.

$$Q_A = C_0 \cdot V_0 \ldots \quad (1)$$

However, when the data is held as shown in FIG. 14, the capacitors C1 to Cn, which could not follow when data is written, receive charge from the ideal capacitor C0 and sequentially store charge in accordance with their respective relaxation times. Series circuits which cannot store charge are shown by broken lines.

As a result, as shown by the equation (2) below, the voltage V of the electrodes of the storage capacitor CP is given as the voltage $V_0$ divided by the capacitance including the polarization components.

$$V = V_0/(C_0+C_1+C_2+\ldots) \quad (2)$$

In this condition, when data is read as shown in FIG. 15, the capacitors C1 to Cn cannot follow the reading of charge if the frequency of the applied voltage for reading is higher than $1/\tau 1$, and then only the charge remaining in the ideal capacitor C0 is read, resulting in partial loss of the stored charge.

In the equation (3) below, the read charge $Q_B$ is given as a product of the capacitance $C_0$ of the ideal capacitor C0 and the voltage V of the electrodes of the storage capacitor CP.

$$Q_B = C_0 \cdot V \quad (3)$$
$$= \left(1 - \frac{C_1 + C_2 \ldots}{C_0 + C_1 + C_2 \ldots}\right) \cdot Q_A$$

In this way, the charge of the ideal capacitor C0 transfers to the capacitors C1 to Cn and as a result the charge of the storage capacitor CP is dissipated. In a BST capacitor formed by a conventional method, the amount of charge lost due to such behavior may reach a maximum of 20% of the amount of stored charge. This causes problems in the memory operation and therefore the dielectric loss should be reduced as well as the leakage current.

Now a conventional method for manufacturing a storage capacitor is briefly explained. After formation of the capacitor portion, an oxygen annealing process is performed for about 20 minutes at 300 to 500° C. in order to repair damage produced during formation of the capacitor electrodes.

Such a process for repairing damage is necessary if a polycrystalline material formed of metal oxide, such as BST and PZT (lead zirconate titanate), is used as the capacitor dielectric. Omitting the oxygen annealing will result in problems such as an increase in leakage current, reduction in breakdown voltage, etc. When $Ta_2O_5$ is used as the dielectric, for example, ozone annealing is effective as well as the oxygen annealing.

Figure 16:
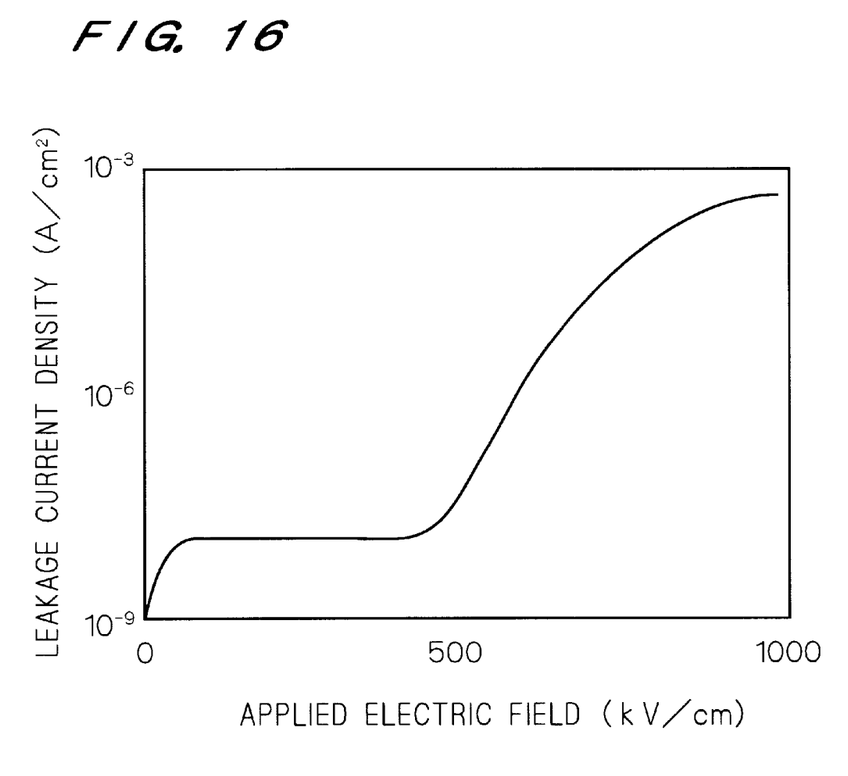
FIG. 16 is a diagram used to explain a characteristic of a dielectric film formed by a conventional manufacturing method.

However, when the breakdown voltage is recovered by such oxygen annealing, the leakage current characteristic is such as shown in FIG. 16.

In FIG. 16, the horizontal axis shows the applied voltage to the electrodes in terms of electric field strength (kV/cm) and the vertical axis shows the leakage current density, where a current component having small electric field dependence is seen in the relatively low electric field range of 500 kV/cm or lower.

This current component depends on the voltage application time; the current value I is often represented, with respect to the voltage application time t, as $I = A \cdot t(-\alpha)$ ($\alpha$, A are constants), which is called absorption current.

The integral amount of the absorption current corresponds to the amount of dissipated charge in the stored charge in the storage capacitor, whose value must be reduced to $\frac{1}{5}$ to $\frac{1}{10}$ to enable stable operation of the semiconductor device.

Actually, for a reason in measurement, what is measured is not the absorption current, but measurements of dielectric loss tangent (tan $\delta$) with an LCR meter are used as indication, where its allowable range has conventionally been tan $\delta = 0.01$ to 0.03.

SUMMARY OF THE INVENTION

A first aspect of the present invention is directed to a method for manufacturing a semiconductor device which comprises an underlying layer and a plurality of capacitors formed on said underlying layer, each of said plurality of capacitors having a lower electrode, a polycrystalline dielectric film, and an upper electrode provided in opposed relation to the lower electrode with the polycrystalline dielectric film interposed therebetween. According to the present invention, the method comprises the steps of: (a) forming the lower electrodes, the polycrystalline dielectric films, and the upper electrodes in order on the underlying layer to form the capacitors; (b) after formation of the upper electrodes, applying a rapid thermal annealing to at least the plurality of capacitors; and (c) after the rapid thermal annealing, performing an annealing in an oxidative gas.

Preferably, according to a second aspect, the semiconductor device manufacturing method further comprises, between the step (b) and the step (c), a step (d) of exposing at least the plurality of capacitors to a plasma comprising an oxidative gas.

Preferably, according to a third aspect, in the semiconductor device manufacturing method, the step (b) comprises a step of heating at 500 to 800° C. for 3 to 60 seconds.

Preferably, according to a fourth aspect, in the semiconductor device manufacturing method, the oxidative gas comprises at least one of an oxygen gas and a gas composed of molecules including oxygen atoms, and the step (c) comprises a step of heating at 300 to 550° C. for 30 minutes to 6 hours in the oxidative gas.

Preferably, according to a fifth aspect, in the semiconductor device manufacturing method, the step (a) comprises a step of forming at least the lower electrodes or the upper electrodes with one element in the platinum group elements or an alloy comprising at least one element in the platinum group elements.

Preferably, according to a sixth aspect, in the semiconductor device manufacturing method, the step (d) comprises a step of heating at least the plurality of capacitors at 300 to 500° C.

Preferably, according to a seventh aspect, the semiconductor device manufacturing method further comprises, between the step (b) and the step (c), a step (d) of applying ultraviolet radiation to an oxidative gas to activate oxygen and exposing at least the plurality of capacitors to the activated oxygen.

Preferably, according to an eighth aspect, the semiconductor device manufacturing method further comprises, between the step (b) and the step (c), a step (d) of exposing at least the plurality of capacitors to a plasma which comprises fluorine or chlorine.

Preferably, according to a ninth aspect, the semiconductor device manufacturing method further comprises, between the step (b) and the step (c), a step (d) of heating at least the plurality of capacitors to 300 to 550° C. and exposing at least the plurality of capacitors in a gas composed of molecules including fluorine atoms for 30 minutes to 6 hours.

According to the semiconductor device manufacturing method of the first aspect of the invention, a rapid thermal annealing is performed after formation of the capacitors. Oxygen contained in the lower and upper electrodes then leaves and the leaving oxygen is supplied to the interface of the polycrystalline dielectric film and repair crystal defects, thus reducing the dielectric loss of the polycrystalline dielectric film. Further, causing oxygen contained in the lower and upper electrodes to leave also reduces the resistivity of the lower and upper electrodes. Further, an annealing is performed in an oxidative gas after the rapid thermal annealing, which recovers the capacitor breakdown voltage reduced by the rapid thermal annealing.

According to the semiconductor device manufacturing method of the second aspect of the invention, after the rapid thermal annealing and before the annealing in an oxidative gas, at least the plurality of capacitors are exposed to a plasma which contains oxygen, which further reduces the dielectric loss of the polycrystalline dielectric film.

According to the semiconductor device manufacturing method of the third aspect of the invention, the dielectric loss of the polycrystalline dielectric film can be effectively reduced.

According to the semiconductor device manufacturing method of the fourth aspect of the invention, the reduced breakdown voltage of the capacitors can be effectively recovered.

According to the semiconductor device manufacturing method of the fifth aspect of the invention, at least one of the lower and upper electrodes is formed of an element in the platinum group elements or an alloy containing at least one element in the platinum group elements. Such materials do not have strong reducing property, so that the polycrystalline dielectric film is not reduced even if it is made of an easily reduced oxide. Accordingly the insulating property is maintained and the function as a capacitor is not deteriorated.

According to the semiconductor device manufacturing method of the sixth aspect of the invention, the dielectric loss of the polycrystalline dielectric film can be effectively reduced.

According to the semiconductor device manufacturing method of the seventh aspect of the invention, after the rapid thermal annealing and before the annealing in an oxidative gas, ultraviolet radiation is applied to an oxygen-containing gas to activate oxygen and at least the plurality of capacitors are exposed to the activated oxygen. Thus the dielectric loss of the polycrystalline dielectric film can be further reduced without causing charge-up.

According to the semiconductor device manufacturing method of the eighth aspect of the invention, after the rapid thermal annealing and before the annealing in an oxidative gas, the plurality of capacitors are exposed to a plasma which contains fluorine or chlorine, which further reduces the dielectric loss of the polycrystalline dielectric film.

According to the semiconductor device manufacturing method of the ninth aspect of the invention, after the rapid thermal annealing and before the annealing in an oxidative gas, the plurality of capacitors are heated to 300 to 550° C. and exposed in a gas formed of molecules including fluorine atoms for 30 minutes to 6 hours, thus further reducing the dielectric loss of the polycrystalline dielectric film.

The present invention has been made to solve the problem described above, and an object of the present invention is to provide a semiconductor device manufacturing method in which the value of the dielectric loss tangent of the dielectric film forming storage capacitors is reduced to prevent dielectric loss of the stored charge of the storage capacitors.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. Manufacturing Method>

A preferred embodiment of the method for manufacturing a semiconductor device according to the present invention will now be described referring to FIGS. 1 to 7 which show a process of manufacturing a DRAM in order. The structure of the DRAM finally obtained is shown in FIG. 7 which shows the last process.

Figure 1:
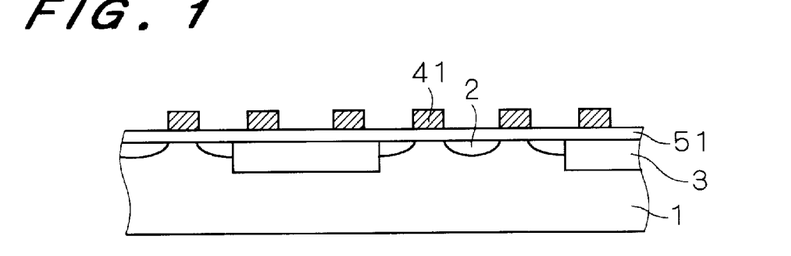
FIGS. 1 to 7 are diagrams used to explain a method for manufacturing a semiconductor device according to a preferred embodiment of the invention.

First, in the process shown in FIG. 1, a silicon substrate 1 is prepared and an element isolation insulating film 3 of oxide film is selectively formed in its surface.

Next, an oxide film 51 as a gate oxide film is formed on the entire surface and gate electrodes 41 are selectively formed on the oxide film 51. In this step, gate electrodes 41 are formed also on the element isolation insulating film 3 to form the transfer gate (word lines).

Then impurity ions are implanted into the silicon substrate 1 right under the oxide film 51 using the gate electrodes 41 as masks to selectively form source/drain layers 2.

Figure 2:
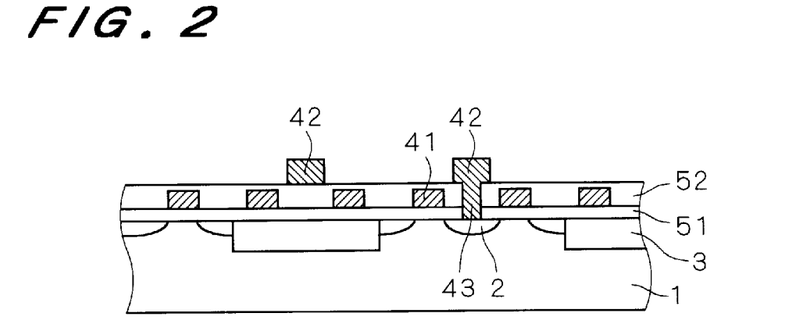

Next, in the process shown in FIG. 2, an interlayer insulating film 52 of oxide film is formed to entirely cover the gate electrodes 41 and a contact hole is selectively formed to reach the source/drain layer 2 through the interlayer insulating film 52 and the oxide film 51 and then a conductor is buried in the contact hole to form a bit line contact 43.

Subsequently, a bit line 42 is formed on the bit line contact 43 to electrically connect the bit line 42 and the source/drain layer 2. A bit line 42 is formed also above the element isolation insulating film 3.

Figure 3:
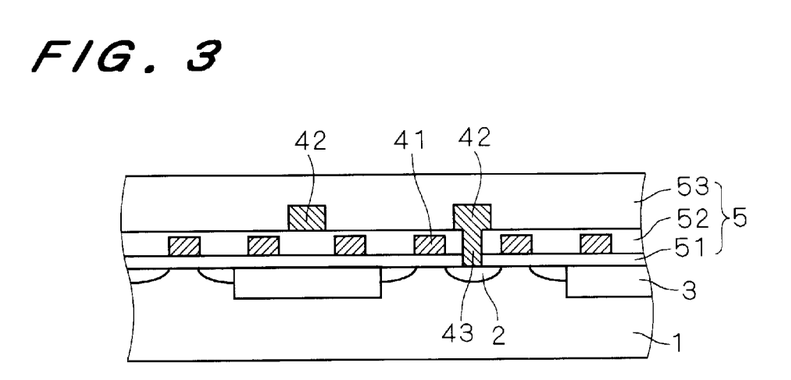

Next, in the process shown in FIG. 3, an interlayer insulating film 53 of oxide film is formed to entirely cover the bit lines 42. The oxide film 51 and interlayer insulating films 52 and 53 are called interlayer insulating film 5 together and these films will be described hereinafter as interlayer insulating film 5. The structure under the interlayer insulating film 5 may be called underlying layer.

Figure 4:
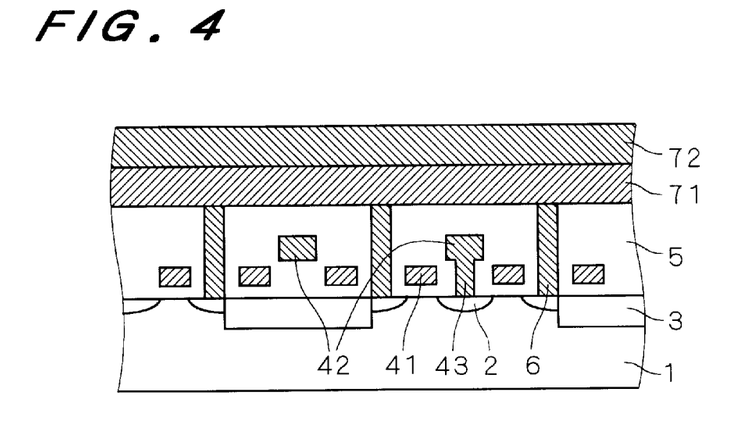

Next, in the process shown in FIG. 4, contact holes passing through the interlayer insulating film 5 are formed by a common dry etching process, which reach the source/drain layers 2 to which the bit line contact 43 is not connected. Then a conductor, e.g. a doped polysilicon layer, is formed on the interlayer insulating film 5 to fill the contact holes and the doped polysilicon layer is removed by etch back only on the interlayer insulating film 5 to form plugs 6. The thickness of the doped polysilicon layer formed on the interlayer insulating film 5 was set to about 1.5 times the opening radius of the contact holes.

The conductor for forming the plugs 6 is not limited to doped polysilicon, but metals such as tungsten (W) or conductive nitrides such as TiN may be used. CMP (Chemical Mechanical Polishing) may be used in the etch back process.

Subsequently, a barrier metal layer 71 of TiN etc. and a bottom electrode 72 of platinum are sequentially laid over the plugs 6 by sputtering.

The thickness of the barrier metal layer 71 and that of the bottom electrode 72 are set in the range of 50 to 200 nm and the range of 10 to 100 nm, respectively.

Figure 5:
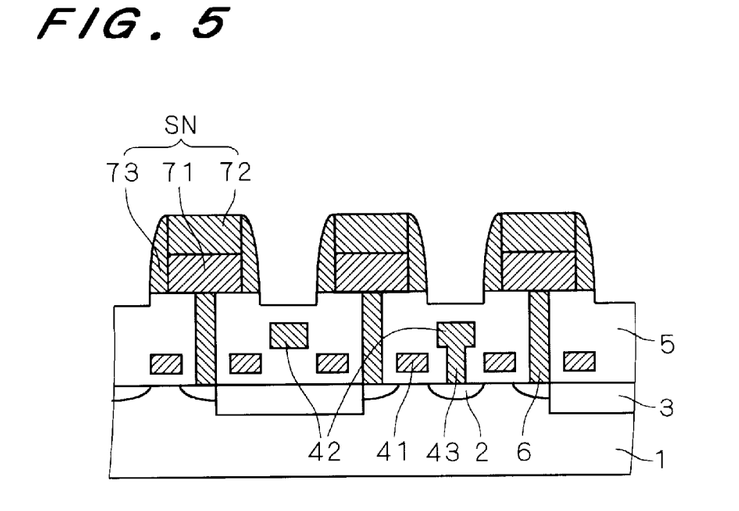

Next, in the process shown in FIG. 5, the barrier metal layer 71 and the bottom electrode 72 are patterned into a predetermined pattern by dry etching and then a platinum layer is formed to a thickness of about 50 nm by sputtering to entirely cover the barrier metal layer 71 and the bottom electrodes 72.

Then the platinum layer is removed by anisotropic etching to form sidewall electrodes 73 on the sides of the barrier metal layers 71 and the bottom electrodes 72 to obtain storage node electrodes SN (lower electrodes). An insulator may be used in place of the bottom electrode 72 in some applications.

The storage node electrodes SN may be formed as a single-layer structure of a thick layer of ruthenium (Ru), instead of the two-layer structure of the barrier metal layer 71 and the bottom electrode 72.

Figure 6:
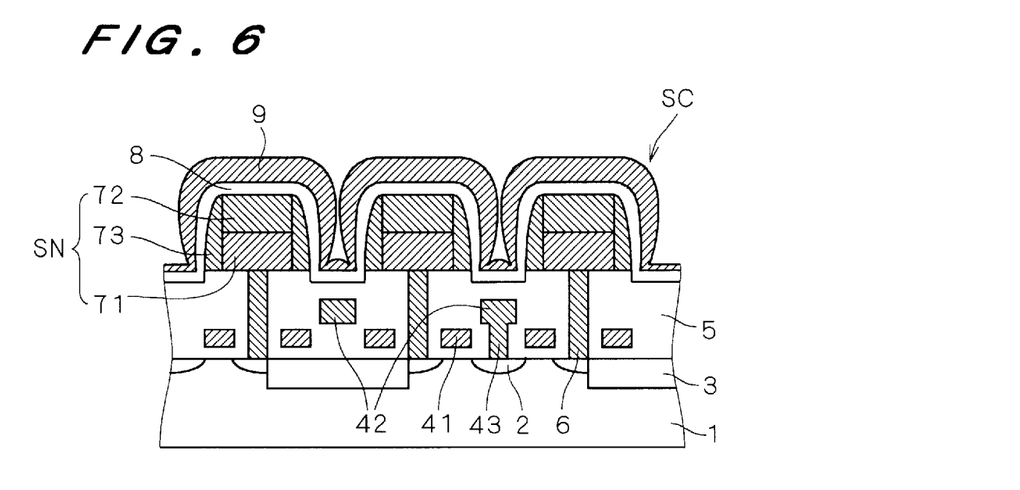
Figure 7:
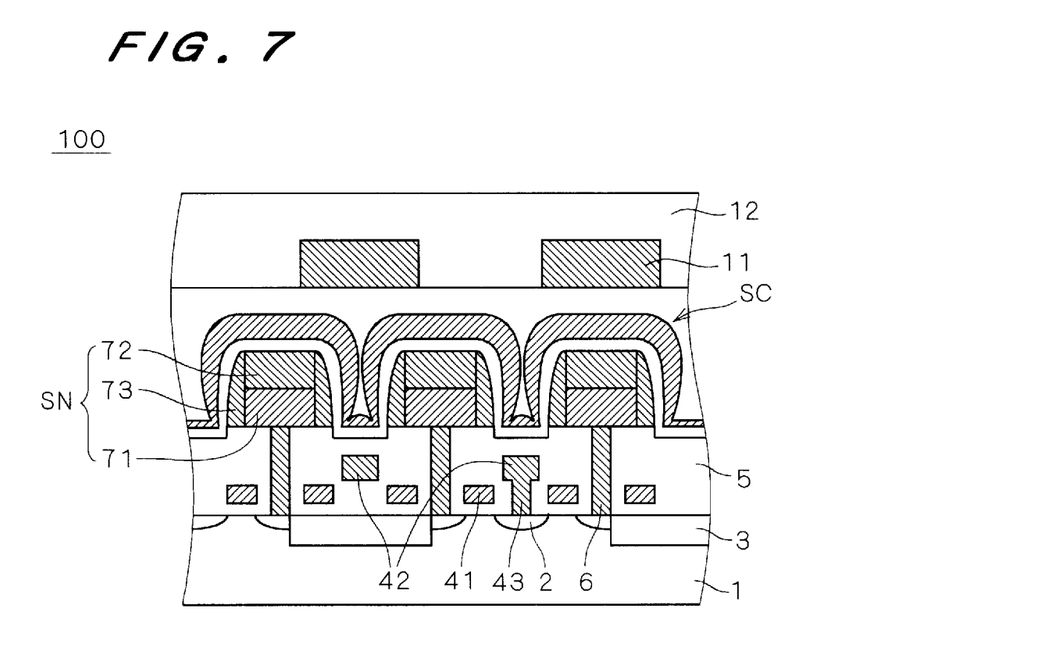

Next, in the process shown in FIG. 6, a BST film is formed by sputtering to entirely cover the storage node electrodes SN, so as to form a dielectric film 8 (polycrystalline dielectric film).

In the formation of the dielectric film 8, a target material is sputtered with ions and atoms generated in a plasma produced by a radio frequency discharge, where the temperature of the silicon substrate 1 is set in the range of 200 to 600° C. and argon gas (Ar) and oxygen ($O_2$) are introduced into the film forming chamber at a ratio of 1:0 or 1:1 with the pressure in the film forming chamber set at about 0.1 Pa (pascals). The radio frequency power inputted to the target material is set at about 1 kW. The thickness of the dielectric film 8 is set at about 60 nm.

While $BaSrTiO_3$ where barium (Ba), strontium (Sr) and titanium (Ti) are in a ratio of 1:1:2 is used as the target material, the ratio of Ba to Sr is not limited to this.

Next, a platinum layer is formed by sputtering to entirely cover the dielectric film 8, thus forming a cell plate 9 (upper electrode). The thickness of the cell plate 9 is about 100 nm.

The storage node electrode SN, dielectric film 8 and cell plate 9 form a stacked capacitor SC.

After formation of the stacked capacitors SC, the silicon substrate 1 is rapidly heated to 500 to 800° C. with, for example, lamp heating, in an atmosphere of nitrogen to perform an RTA (Rapid Thermal Annealing) process for about 3 to 60 seconds. Subsequently, in order to recover the breakdown voltage reduced during RTA, the silicon substrate 1 is heated to 300 to 550° C. in an oxidative gas to perform an annealing process for 30 minutes to 6 hours.

The RTA is not limited to a process in an atmosphere of nitrogen, but it may be performed in a rare gas such as argon, helium, etc.

The oxidative gas includes not only oxygen gas but also those containing oxygen atoms and staying in gas form under lower pressures, such as $O_3$, $NO_2$, NO, $N_2O$, $H_2O_2$, $H_2O$, etc.

Next, in the process shown in FIG. 7, an interlayer insulating film 10 is formed to completely cover the stacked capacitors SC and then a metal interconnection layer 11 is formed on the interlayer insulating film 10, which is followed by formation of a passivation film 12 covering the metal interconnection layer 11.

Finally, in order to repair damage produced during the process, a hydrogen annealing process is performed for 20 minutes in an atmosphere of hydrogen at 400° C., thus completing the DRAM 100.

The material of the bottom electrode 72, sidewall electrodes 73 and cell plate 9 is not limited to platinum, but other elements in the platinum group (Ru, Rh, Pd, Os, Ir) or alloys thereof, or oxides thereof may be used.

Polycrystalline dielectrics like BST are oxides and tend to be easily reduced. Such dielectrics are therefore reduced when brought in contact with a material having strong reducing property, which will result in deterioration of the insulating property. This will ruin the function as a capacitor if occurs in a capacitor portion. However, the platinum group elements and alloys containing platinum group elements do not have such strong reducing property. Hence, the polycrystalline dielectric film is not reduced even if it is made of an easily reduced oxide; it maintains the insulating property and the function as a capacitor is not deteriorated.

<B. Functions and Effects of RTA and Annealing in Oxidative Gas>

Figure 8:
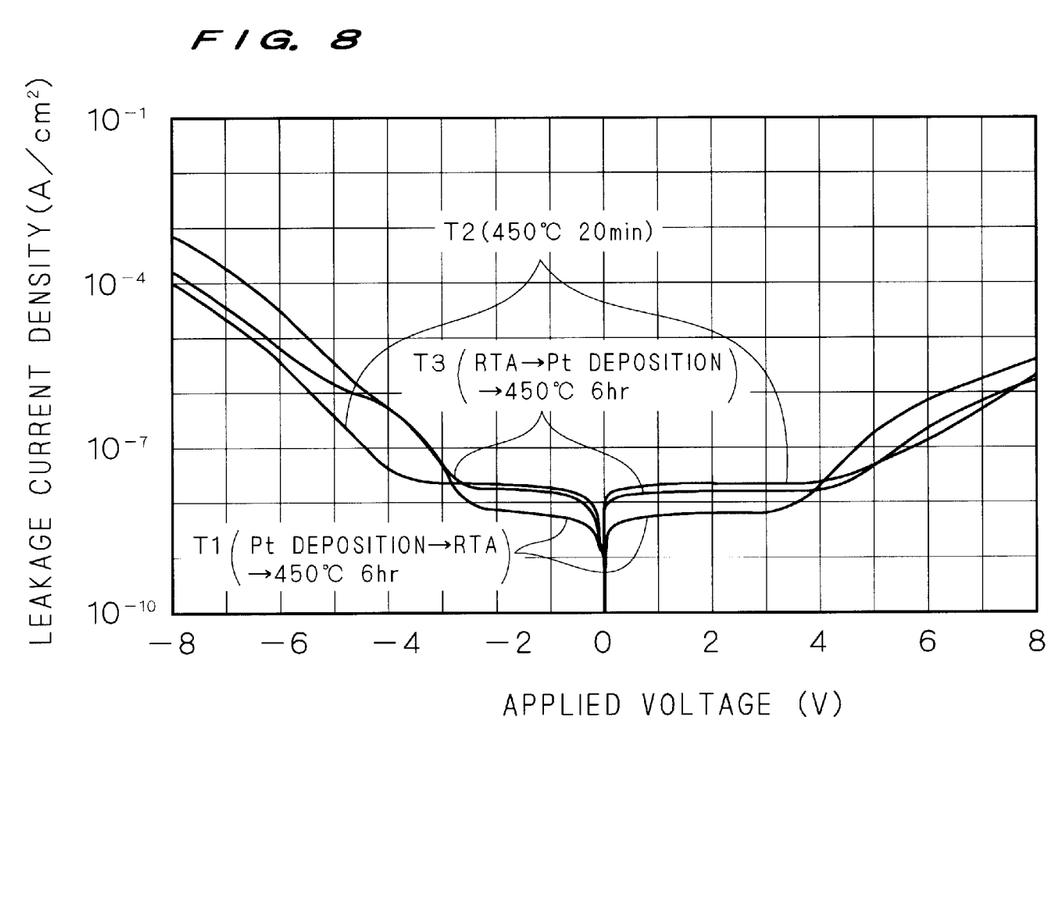
FIG. 8 is a diagram used to explain a characteristic of the dielectric film formed according to the semiconductor device manufacturing method of the preferred embodiment of the invention.

The functions and effects of the RTA and the annealing in oxidative gas will now be described. FIG. 8 shows a leakage current characteristic obtained when the RTA process is performed. The description below shows an example in which oxygen gas is used as the oxidative gas.

In FIG. 8, the horizontal axis shows the applied voltage (V) to the electrodes and the vertical axis shows the leakage current density.

In FIG. 8, the characteristic curve T1 shows the leakage current characteristic which was obtained when the RTA is performed in a nitrogen atmosphere after formation of the stacked capacitors SC, that is, after formation of the platinum (Pt) cell plate 9, and then an oxygen annealing is performed for 6 hours at 450° C. in an oxygen atmosphere.

For comparison, FIG. 8 also shows, as the characteristic curve T2, a leakage current characteristic obtained when an oxygen annealing is performed at 450° C. for about 20 minutes, as in a conventional manufacturing method, in order to repair damage produced during formation of the capacitor electrodes. The characteristic curve T2 on the positive voltage side corresponds to the characteristic curve shown in FIG. 16.

Comparison between the characteristic curves T1 and T2 shows that the absorption current is clearly reduced in the voltage range from −4V to 4V. We measured the dielectric loss tangent (tan δ) of the dielectric film 8 with an LCR meter and obtained a value of about 0.005. Thus, as compared with the conventional manufacturing method in which only the oxygen annealing is performed after formation of the capacitor electrodes, the method including RTA after capacitor electrode formation provides a storage capacitor with remarkably reduced dielectric loss.

The characteristic curve T3 shown in FIG. 8 shows a leakage current characteristic obtained when RTA is performed before formation of the cell plate 9 and then oxygen annealing is performed for 6 hours at 450° C. The characteristic curve T3 does not largely differ from the characteristic curve T2, which shows that performing RTA before the upper electrode formation does not contribute to the reduction of dielectric loss, while performing RTA after formation of the cell plate 9, or the upper electrode, is desirable.

Further, we obtained results showing that performing RTA after long time annealing in oxidative gas increases the leakage current, and it is thus preferable to perform the RTA after formation of the upper electrode and before the oxygen annealing.

Figure 9:
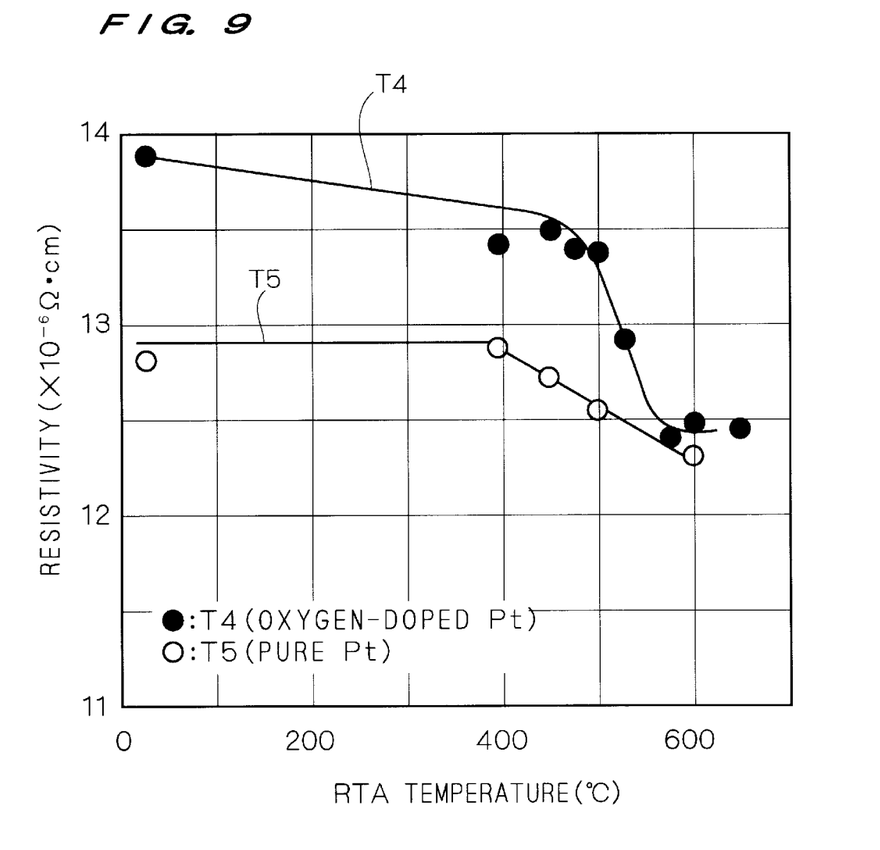
FIG. 9 is a diagram used to explain a characteristic of the electrodes formed according to the semiconductor device manufacturing method of the preferred embodiment of the invention.

The reason why the RTA contributes to the characteristic improvement of the dielectric film is now described referring to FIG. 9. FIG. 9 is a diagram showing variations of resistivity of a platinum film with varying RTA temperature, where the characteristic curve T4 shows a variation of resistivity of an oxygen-doped platinum film and the characteristic curve T5 shows a variation of resistivity of a platinum film with no oxygen doped thereto (pure Pt).

As shown in FIG. 9, while the resistivity of the oxygen-doped platinum film shows values larger by one digit or so than that of the no-oxygen-doped platinum film when the RTA temperature is lower (400° C. or lower), the resistivity rapidly decreases with RTA at 500° C. or higher and becomes equivalent to the resistivity of the no-oxygen-doped platinum film. This shows that RTA at 500° C. or higher causes oxygen in the oxygen-doped platinum film to leave and then the film becomes equivalent to the no-oxygen-doped platinum film. It is hence considered that the oxygen leaving in this process is supplied to the interface of the dielectric film 8 and repairs crystal defects, thus contributing to the reduction of the dielectric loss.

Since the dielectric film 8 is formed by sputtering in an atmosphere of mixture of argon and oxygen, oxygen is contained in the storage node electrode SN (lower electrode) formed prior to the formation of the dielectric film 8 and in the cell plate 9 (upper electrode) formed over the dielectric film 8. The oxygen leaves in the RTA at 500° C. or higher and contributes to the reduction of the dielectric loss of the dielectric film 8, and it also improves the resistivity of the platinum electrodes as shown by the characteristic curve T4.

The platinum film with no oxygen doped thereto shown in FIG. 9 is a film formed by sputtering in an argon atmosphere. The resistivity is reduced in RTA at 400 to 500° C. as shown by the characteristic curve T5 because the composition was improved by RTA.

<C. First Modification>

In the above-described manufacturing method of the preferred embodiment of the present invention, RTA is performed after formation of the stacked capacitors SC so that oxygen leaving from the platinum electrodes is supplied to the interface of the dielectric film 8 to reduce the dielectric loss; the process described below may be added to sufficiently supply oxygen to the dielectric film 8.

That is to say, after performing RTA following the formation of the stacked capacitors SC, an oxygen plasma process is added before the annealing in an oxidative gas.

Oxygen plasma process means application of various processes by exposing the object semiconductor substrate to an oxygen plasma formed by radio frequency discharge (or direct-current or microwave discharge); for an example of the process conditions, the semiconductor substrate which has undergone RTA is exposed to an oxygen plasma for about 10 minutes, where the temperature of the semiconductor substrate is kept at about 300 to 500° C., the pressure of the process gas serving as an oxygen supply source in the processing chamber is set at about 2.66 Pa (20 mTorr), and the radio frequency power for plasma generation is set at about 300 W.

Figure 10:
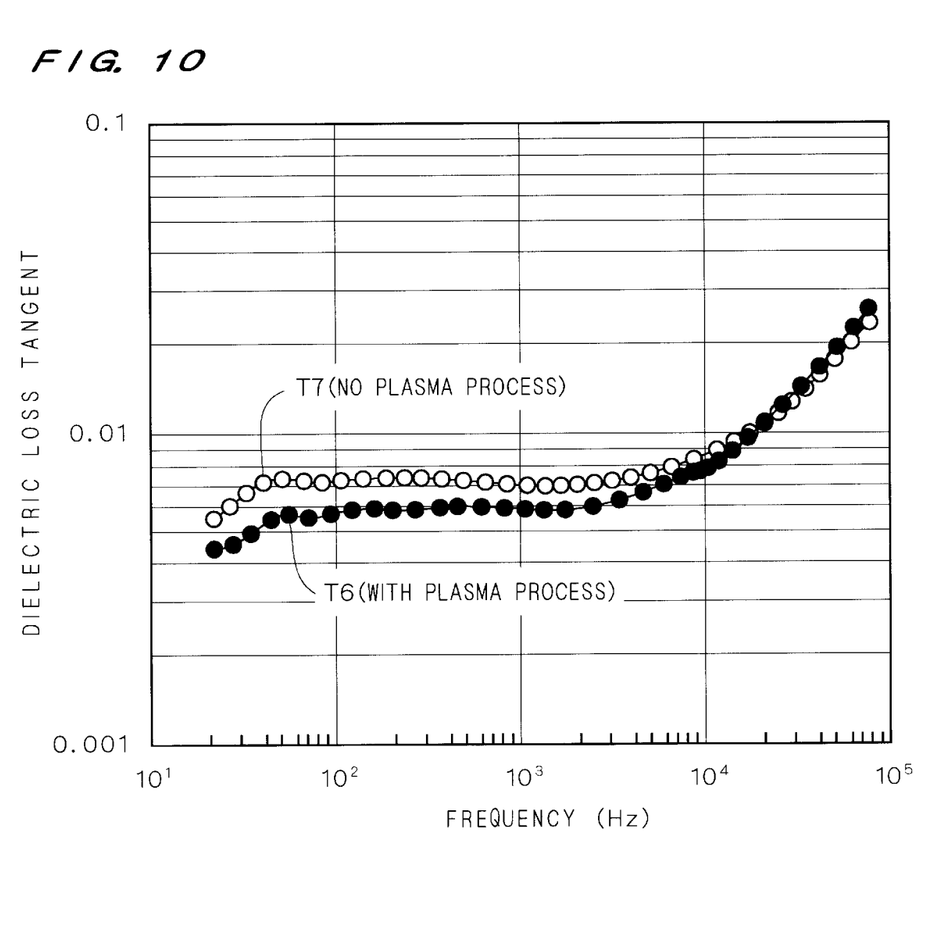
FIG. 10 is a diagram used to explain a characteristic of a dielectric film formed according to a manufacturing method of a modification of the preferred embodiment of the invention.

FIG. 10 shows a difference in frequency characteristic of the dielectric loss tangent of the dielectric film 8 between an example involving the oxygen plasma processing and an example not involving the processing.

In FIG. 10, the characteristic curve T6 shows that obtained when RTA performed after formation of the stacked capacitors SC is followed by an oxygen plasma processing and then by an oxygen annealing in an oxygen gas, and the characteristic curve T7 shows that obtained when RTA performed after formation of the stacked capacitors SC is followed by an oxygen annealing.

In FIG. 10, the characteristic curve T6 shows lower dielectric loss tangents than the characteristic curve T7 in the frequency range of 20 Hz to $1 \times 10^4$ Hz, which shows that application of the oxygen plasma process further reduces the dielectric loss as compared with application of only the RTA and oxygen annealing.

The conditions of the plasma processing are not limited to those shown above; the substrate temperature may be at around room temperature (24° C., for example), but performing the process at a maximum temperature allowed by the device structure is more effective.

Oxidative gases can be used as the process gas (not only oxygen gas but also those containing oxygen atoms and staying in gas form at lower pressures, such as $O_3$, $NO_2$, NO, $N_2O$, $H_2O_2$, $H_2O$, etc., may be used).

The pressure in the chamber and the RF power are not limited to those shown above, but the timing of plasma processing is limited to after RTA. Performing it before RTA provides no effect.

While some dielectric films may require thermal processing or oxidation processing before formation of the upper electrode. The present invention does not deny the effects of these processes.

<D. Second Modification>

The above-described first modification of the preferred embodiment manufacturing method of the present invention has shown an example in which an oxygen plasma processing is added to supply oxygen to the dielectric film 8. A process of exposing the semiconductor substrate in an oxidative gas excited by ultraviolet rays may be used instead of the oxygen plasma processing.

That is to say, after performing RTA following the formation of the stacked capacitors SC and before performing annealing in an oxidative gas, the semiconductor substrate is kept at a temperature of about 550° C. and a process gas as an oxygen supply source, e.g. ozone ($O_3$), is supplied into the processing chamber at a pressure of about 0.133 Pa (1 mTorr) to 3 atmospheric pressures, and ultraviolet radiation having a wavelength of 248 nm is applied for 10 minutes, for example.

The ultraviolet radiation activates ozone, which is supplied to the dielectric film 8 as ozone molecules or oxygen molecules. Charge-up is not caused in the semiconductor substrate since plasma is not used.

The process gas is not limited to ozone, but oxidative gas which contains oxygen, such as $NO_2$, $NO$, $N_2O$, $H_2O_2$, etc. may be used.

The gas pressure in the processing chamber and the processing time are not limited to the conditions above, but it is more effective to set the semiconductor substrate at a maximum temperature allowed by the device structure, preferably at 300° C. or higher at least.

<E. Third Modification>

The above-described preferred embodiment manufacturing method of the invention and its modifications have shown examples in which oxygen is supplied to the dielectric film 8 (polycrystalline dielectric film) to repair crystal defects. However, the element used to repair crystal defects is not limited to oxygen.

That is to say, elements which can be bound to valence electrons or lone pairs in the crystal defect portions of the dielectric film 8, such as fluorine (F) or chlorine (Cl), can restrict the carrier movement and reduce the dielectric loss of the dielectric film 8.

More specifically, after RTA following the formation of the stacked capacitors SC, a process of exposing the semiconductor substrate to a plasma which contains fluorine or chlorine is added before the oxygen annealing.

For the process conditions, for example, the semiconductor substrate subjected to RTA is exposed to a $CF_4$ plasma for about 10 minutes, where the temperature of the semiconductor substrate is kept at around room temperature (e.g. 24° C.), $CF_4$ gas is used as the process gas in the processing chamber at a pressure of about 2.66 Pa (20 mTorr), and radio frequency power for plasma generation is set at about 300 W.

The process gas is not limited to $CF_4$ gas, but gases containing Cl or F atoms, such as $Cl_2$, $CHCl_3$, $CH_2Cl_2$, $CCl_4$, $CHF_3$, $CH_2F_2$, etc., may be used, and a plasma containing at least one kind or more of these gases is produced.

Further, the process temperature is not limited to room temperature, but the processing may be performed at temperatures ranging from room temperature to about 500° C.

Instead of the processing of exposing the semiconductor substrate to a plasma which contains fluorine or chlorine, the semiconductor substrate may be exposed in a gas which contains fluorine or chlorine to repair crystal defects in the dielectric film 8.

In this case, the semiconductor substrate is heated to 300 to 550° C. and exposed in a gas composed of molecules containing fluorine atoms for 30 minutes to 6 hours.

While the invention has been described in detail, the foregoing description is in all aspects illustrative and not restrictive. It is understood that numerous other modifications and variations can be devised without departing from the scope of the invention.

What is claimed is:

1. A method for manufacturing a semiconductor device which comprises an underlying layer and a plurality of capacitors formed on said underlying layer, each of said plurality of capacitors having a lower electrode, a polycrystalline dielectric film, and an upper electrode provided in opposed relation to said lower electrode with said polycrystalline dielectric film interposed therebetween, said method comprising the steps of:

(a) forming, after patterning said lower electrodes, said polycrystalline dielectric films, and said upper electrodes in order on said underlying layer to cover said lower electrodes which were patterned, thereby completing said capacitors;

(b) after completion of said capacitors, applying a rapid thermal annealing to at least said plurality of capacitors; and (c) after said rapid thermal annealing, performing an annealing in an oxidative gas.

2. The semiconductor device manufacturing method according to claim 1, wherein said step (b) comprises a step of heating at 500 to 800° C. for 3 to 60 seconds.

3. The semiconductor device manufacturing method according to claim 1, wherein said oxidative gas comprises at least one of an oxygen gas and a gas composed of molecules including oxygen atoms, and said step (c) comprises a step of heating at 300 to 550° C. for 30 minutes to 6 hours in said oxidative gas.

4. The semiconductor device manufacturing method according to claim 1, wherein said step (a) comprises a step of forming at least said lower electrodes or said upper electrodes with one element in the platinum group elements or an alloy comprising at least one element in the platinum group elements.

5. The semiconductor device manufacturing method according to claim 1, further comprising, between said step (b) and said step (c), a step (d) of applying ultraviolet radiation to an oxidative gas to activate oxygen and exposing at least said plurality of capacitors to said activated oxygen.

6. The semiconductor device manufacturing method according to claim 1, further comprising, between said step (b) and said step (c), a step (d) of exposing at least said plurality of capacitors to a plasma which comprises fluorine or chlorine.

7. The semiconductor device manufacturing method according to claim 1, further comprising, between said step (b) and said step (c), a step (d) of heating at least said plurality of capacitors to 300 to 550° C. and exposing at least said plurality of capacitors in a gas composed of molecules comprising fluorine atoms for 30 minutes to 6 hours.

8. The semiconductor device manufacturing method according to claim 1, further comprising, between said step (b) and said step (c), a step (d) of exposing at least said plurality of capacitors to a plasma comprising an oxidative gas.

9. The semiconductor device manufacturing method according to claim 8, wherein said step (b) comprises a step of heating at 500 to 800° C. for 3 to 60 seconds.

10. The semiconductor device manufacturing method according to claim 8, wherein said oxidative gas comprises at least one of an oxygen gas and a gas composed of molecules including oxygen atoms, and said step (c) comprises a step of heating at 300 to 550° C. for 30 minutes to 6 hours in said oxidative gas.

11. The semiconductor device manufacturing method according to claim 8, wherein said step (a) comprises a step of forming at least said lower electrodes or said upper electrodes with one element in the platinum group elements or an alloy comprising at least one element in the platinum group elements.

12. The semiconductor device manufacturing method according to claim 8, wherein said step (d) comprises a step of heating at least said plurality of capacitors at 300 to 500° C.

* * * * *

UNITED STATES PATENT AND TRADEMARK OFFICE
CERTIFICATE OF CORRECTION

PATENT NO. : 6,506,613 B1
DATED : January 14, 2003
INVENTOR(S) : Okudaira It is certified that error appears in the above-identified patent and that said Letters Patent is hereby corrected as shown below:

<u>Title page, Item [54] and Column 1, lines 1-3,</u>
Should read:
-- [54] SEMICONDUCTOR DEVICE MANUFACTURING METHOD --

Signed and Sealed this

First Day of July, 2003

JAMES E. ROGAN
*Director of the United States Patent and Trademark Office*